US008081426B2

(12) United States Patent
Archer et al.

(10) Patent No.: US 8,081,426 B2
(45) Date of Patent: Dec. 20, 2011

(54) CALIBRATION MODULE SHIELD AND PROTECTION METHOD

(75) Inventors: Terry Archer, Jonesborough, TN (US); Jennifer Nuckolls, Kingsport, TN (US); Timothy Allen Dyer, Bluff City, TN (US); Norbert Lindner, Amberg (DE)

(73) Assignee: Siemens Industry, Inc., Alpharetta, GA (US)

( * ) Notice: Subject to any disclaimer, the term of this patent is extended or adjusted under 35 U.S.C. 154(b) by 465 days.

(21) Appl. No.: 12/404,621

(22) Filed: Mar. 16, 2009

(65) Prior Publication Data

US 2010/0231230 A1 Sep. 16, 2010

(51) Int. Cl.

| | |
|---|---|
| ***H05K 5/00*** | (2006.01) |
| ***H02B 1/04*** | (2006.01) |
| ***G01R 31/00*** | (2006.01) |
| ***G01R 35/00*** | (2006.01) |
| ***G01R 11/32*** | (2006.01) |
| ***E05B 15/00*** | (2006.01) |
| ***E05B 9/00*** | (2006.01) |

(52) U.S. Cl. .................. 361/679.01; 361/634; 361/365; 361/679.02; 361/636; 361/679.04; 324/750.01; 324/750.02; 324/601; 324/74; 70/442; 70/443; 70/416

(58) Field of Classification Search .................. 361/102, 361/114–116, 634–636, 651–658, 667, 669–673; 324/750.01–750.07, 601, 74, 76.11, 130; 70/440–448, 416–421

See application file for complete search history.

(56) References Cited

U.S. PATENT DOCUMENTS

| | | | | |
|---|---|---|---|---|
| 4,833,563 | A * | 5/1989 | Russell | 361/92 |
| 6,614,237 | B2 * | 9/2003 | Ademian et al. | 324/601 |
| 6,792,364 | B2 * | 9/2004 | Jonker et al. | 702/61 |

* cited by examiner

*Primary Examiner* — Jayprakash N Gandhi
*Assistant Examiner* — Jerry Wu

(57) ABSTRACT

An apparatus and method for preventing access to calibration controls includes a primary cover including a connection device, an access opening and a first through hole. The primary cover is configured to exclude access to an underlying area. The access opening is located on the primary cover to permit access to the underlying area when securing the primary cover. A shield is configured to fit over the primary cover and prevent access to the access opening. The shield includes a latch portion configured to latch on a first end portion of the primary cover and a second through hole located at a second end portion and corresponding to the first through hole of the primary cover. A security mechanism is configured to be received in the first and second through holes such that the security mechanism shows signs of tampering when unauthorized access to the underlying area is attempted.

19 Claims, 3 Drawing Sheets

CALIBRATION MODULE SHIELD AND PROTECTION METHOD

BACKGROUND

1. Technical Field

This disclosure relates to calibration device protection, and more particularly, to a system and method for write protecting and preventing access to a calibration system for calibrated measurement devices.

2. Description of the Related Art

Standard weights and measures for industrial applications is an important consideration for vendors and purchasers alike. Using a properly calibrated scale is important in such industries as construction, agriculture and transportation. Measurement devices must be certified in order to instill confidence that a vendor is supplying a correct amount and a purchaser is receiving what they paid for. In one example, certification of a weight module for a process control system, such as a Siemens Simatic® needs for a module to be calibrated and a U.S. Government seal wire to be affixed to prevent the modification of the weight module calibration routine. In fact, such certification is requires in legal-for-trade applications.

While the seal wire provides assurance that the module has been calibrated, the application of the U.S. Government wire seal mechanism, affixed to a calibration cover plate, in its current form cannot prevent removal of the calibration cover plate and possible access to the calibration mechanism.

SUMMARY OF THE INVENTION

An apparatus and method includes a primary cover having a connection device, an access hole and a first through hole. The primary cover is configured to cover and exclude access to an underlying area where calibration controls are located. The access hole is located adjacent to the connection device to permit access to the underlying area when securing the primary cover. A shield is configured to fit over the primary cover and prevent access to the access hole. The shield includes a latch portion configured to latch on a first end portion of the primary cover and a corresponding second through hole located at a second end portion opposite the first end portion. A security mechanism is configured to be received in the first and second through holes such that the security mechanism needs to be destroyed to access the underlying area.

An apparatus and method for preventing access to write protected calibration parameters includes a primary cover including a connection device, an access opening and a first through hole. The primary cover is configured to cover and exclude access to an underlying area where calibration controls are located. The access opening is located on the primary cover to permit access to the underlying area when securing the primary cover. A shield is configured to fit over the primary cover and prevent access to the access opening. The shield includes a latch portion configured to latch on a first end portion of the primary cover and a second through hole located at a second end portion opposite the first end portion and corresponding to the first through hole of the primary cover. A security mechanism is configured to be received in the first and second through holes such that the security mechanism shows signs of tampering when unauthorized access to the underlying area is attempted.

A method for preventing access to write protected calibration parameters includes eliminating access to an underlying area where calibration controls are located by installing a primary cover including a connection device and an access opening which permits access to the underlying area when securing the primary cover; securing the primary cover using the connection device by accessing the underlying layer through the access opening; placing a shield configured to fit over the primary cover to prevent access to the access opening, the shield including a latch portion configured to latch on a first end portion of the primary cover; and sealing the primary cover and the shield with a security mechanism which passes through a first through formed in the primary cover and a second through hole formed in the shield at a corresponding location such that the security mechanism needs to be overcome to access the underlying area.

These and other objects, features and advantages of the detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present principles provide calibration protection to prevent tampering with a calibration device. In accordance with an illustrative embodiment, a calibration plate seal shield is provided with a U.S. Government wire seal. The seal shield prevents access to the calibration mechanism of a process control system with the further protection of the wire seal to ensure that unauthorized access to the calibration mechanism is prevented.

While the present invention will be described in terms of a particular calibration device configuration, it should be understood that the present invention is not limited to the illustrative example and may be employed with other device configurations. The present embodiments may be employed in legal-for trade applications, such as weighing commodities in industries such as construction, agriculture, transportation, waste management, etc. The present embodiments may include any calibrated device or system.

The functions of calibration mechanisms such as a weighing module can be provided through the use of dedicated hardware as well as hardware capable of executing software in association with appropriate software. When provided by a processor, the functions of the calibration mechanisms can be provided by a single dedicated processor, by a single shared processor, or by a plurality of individual processors, some of which can be shared. Moreover, explicit use of the term "processor" or "controller" should not be construed to refer exclusively to hardware capable of executing software, and can implicitly include, without limitation, digital signal processor ("DSP") hardware, read-only memory ("ROM") for storing software, random access memory ("RAM"), and non-volatile storage. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure).

Figure 1:
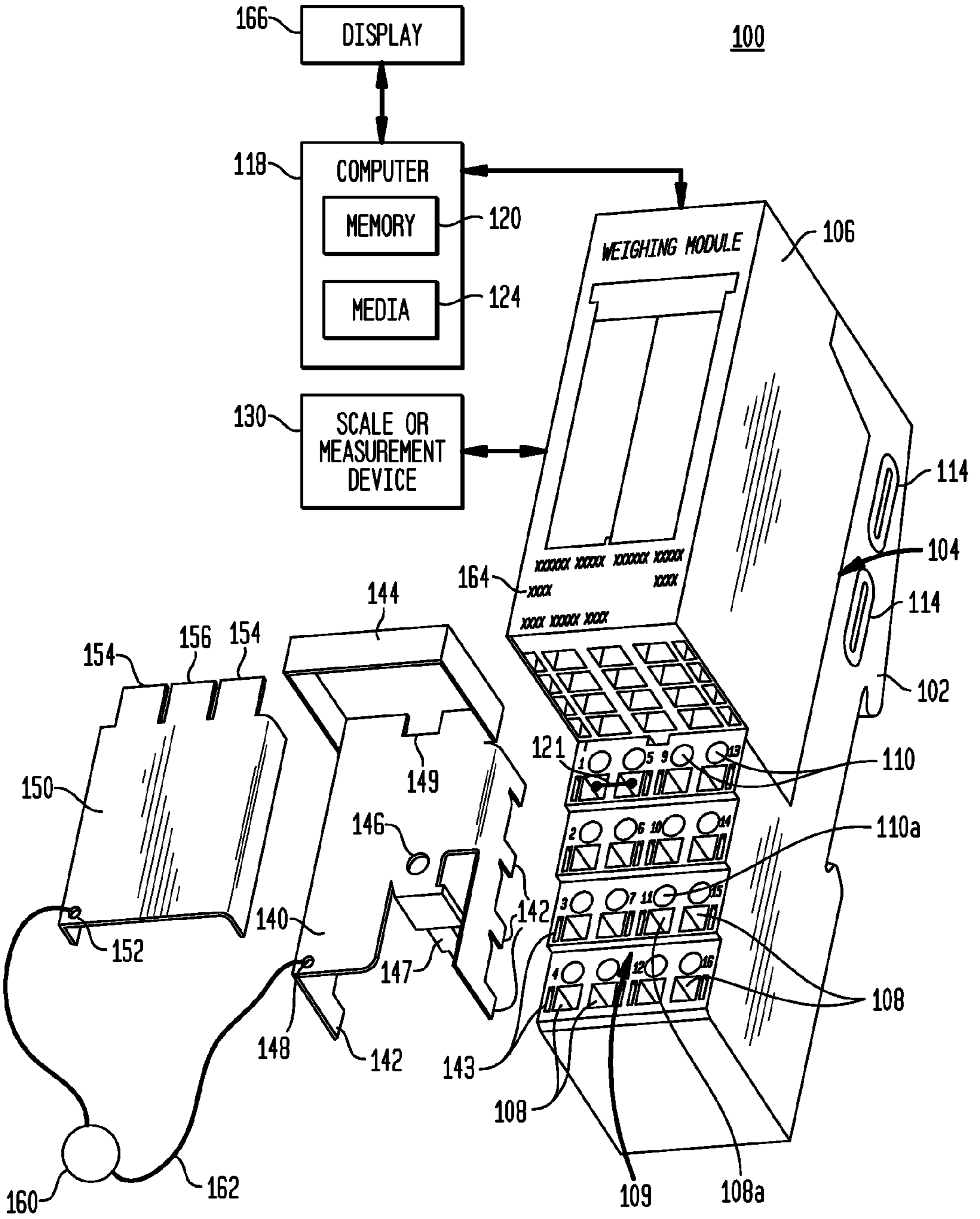
FIG. 1 is a diagram showing a weighing model with an exploded view of a primary cover and a shield for protecting the weighing module's calibration access controls in accordance with the present principles.

Referring now in specific detail to the drawings in which like reference numerals identify similar or identical elements throughout the several views, and initially to FIG. 1, a calibration device 100 is depicted for an illustrative embodiment. The calibration device 100 is connectable to/with a measurement device or system 130 such as a weight scale, an emissions tester, a spectrum analyzer or any other device that is employed to make a measurement in accordance with a certified calibration scale, function or curve. For demonstrative purposes, the present description will be focused on a weighing application. It should be understood that the weighing application should not be construed as limiting.

In the example, the calibration device 100 includes a terminal module 102. The terminal module 102 includes an interface 104 for receiving a weighing module 106. The interface 104 of the terminal module 102 includes mechanical and electrical connections with the terminal module 102. Terminal module 102 includes a connection board 109 with a plurality of terminals 108 which are accessible for connecting wires or devices. Each terminal 108 may include a fixing screw 110 configured to secure or otherwise connect with a wire. A wire can be placed inside the terminal 108 and secured by tightening the screw 110. Other securing methods may also be employed. Also, other calibration controls may be employed such as knobs, switches, punch keys, etc. on the connection board 109.

Terminals 108 connect with inputs on a back side (not shown) of the weighing module 106. In this case, the inputs at the interface 104 are in electrical communication with terminals 108. The terminal module 102 includes one or more connectivity ports 114, which may include an RS232, four or eight wire connections or equivalent interfaces for interacting with at least one computer device 118, with at least one measurement device 130 and any other equipment or peripherals needed for the application. The computer device 118 may include a computer or a specially configured device that executes a program of instructions for calibration of the weighing module 106. The computer device 118 includes a computer readable memory 120 that stores one or more programs for interfacing with and calibrating the weighing module 106.

A custom program is provided with a computer-usable or computer readable medium 124 which permits the computer device 118 to interface with the weighing module 106. For the purposes of this description, a computer-usable or computer readable medium 124 can be any apparatus that may include, store, communicate, propagate, or transport the program for use by or in connection with the instruction execution system, apparatus, or device. The medium 124 can be an electronic, magnetic, optical, electromagnetic, infrared, or semiconductor system (or apparatus or device). Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

After implementing a calibration program using the computer device 118 or other interface, the weighing module 106 is properly configured using standard weights and measures to determine a calibration curve (or transfer function) with specific data points. For example, in one embodiment, a scale 130 is employed to measure the weight of a cement bag. The weight of the bag is typically about 50 pounds, as such the scale 130 should be particularly accurate at this weight level. A standard 50 pound weight is preferably employed to calibrate the scale 130. Other weights may also be employed to generate a calibration curve. Points between the standard weights on the calibration can be interpolated. The number of points and the accuracy of the standard weight depend on the accuracy needed for the weight measurement. The calibration curve is preferably stored in the weighing module 106. The weighing module 106 is then write protected to prevent tampering with the calibration.

Weights, of say, a ton or more would not be useful with a scale for measuring 50 pounds, but the method for calibration would be the same for different scale ranges. Different systems may include different calibration methods, different calibration software programs and different types of calibration control modules.

The weighing module 106 may be calibrated by interfacing with the computer device 118, a display screen 166 and using input peripherals, which may include, for example, a keyboard, mouse, touch screen, etc. A user interfaces with the weighing module 106 during calibration or to review calibration or other operating criteria. Once calibrated, the weighing module 106 needs to be write protected. This may be performed in a number of ways, for example, by inputting a code, using a mechanical key, by making an electrical connection between nodes of a circuit, etc. In one particularly useful embodiment, write protection is provided by making a connection between two (or more) terminals 108 on the connection board 109 of the terminal module 102. In an example, a jumper wire 121 connects two connection points to provide a bypass to create a write protected weighing module 106. Access to this jumper 121 now needs to be restricted.

A primary cover 140 is installed over the connection board 109. The cover 140 includes tabs 142, which are received in corresponding slots 143 of the connection board 109. An angled projection 147 is configured to correspond with one of the terminals 108*a* and is received therein when affixing the cover 140 to the connection board 109. An opening 146 in the cover 140 is provided to permit access to an underlying area where a fixing screw 110*a* is located. The fixing screw or other securing device 110*a* is employed to secure the cover 140 once projection is inserted and the primary cover 140 is installed. Primary cover 140 includes a guard 144 to assist in preventing tampering with the weighing module 106 and the connection board 109.

A shield or terminal cover 150 is installed on and over the primary cover 140. In one embodiment, the shield 150 includes a latch portion 156 that latches over a notch section 149 of the primary cover 140. Adjacent to the latch portion 156 are two protective extensions 154 which assist in making it difficult to tamper with the latch portion 156. Protective extensions 154 also provide strength to the latch portion 156 and help resist bending of the latch portion 156 which could compromise its mechanical integrity. Lateral portions 158 conform with and fit over the primary cover 140. After the terminal cover 150 is fitted, a certification stamp and calibration seal are attached by a calibration official.

After the calibration of the module 106 is verified, the official employs a crush wire 162 and a seal 160 (wire seal) for certifying the calibration. The wire 162 is passed through a hole 148 of the primary cover 140 and a hole 152 of the shield 150. The wire 162 is protected by the seal 160 so that it cannot be opened unless the wire 162 is broken. The seal 160 preferably receives ends of the wire 162 and permanently encapsulates and captures the ends of the wire 162 to prevent access. In case of a tampering attempt, the wire 162 would need to be broken to remove the shield 150 and access the connection panel 109. Other mechanisms may also be employed to prevent access to the calibration stored in weighing module 106. For example, a pad lock or other device may be employed.

It should be understood that the shield 150 protects the primary cover 140 and prevents access to hole 146, which in turn provides access to the fixing screw 110*a* for releasing the primary cover 140.

In accordance with a particularly useful embodiment, calibration certification is followed by mechanical and data sealing of the terminal module 102. On the connection plate 109 of the terminal module 102, the jumper 121 can be inserted to write protect the weighing module 106. If this jumper 121 is inserted, the following operations are blocked on every interface: 1) execution of adjustment commands that influence a scale characteristic curve; 2) transfer of calibration parameters to the scale 130; and 3) transfer of internal process values to the scale (130).

In calibrating operations, the jumper 124 is fixed in place to the terminal block 102 before the primary cover 140 and the terminal cover 150 are attached and sealed. If the jumper 121 is inserted, an indicator light or warning device, such as a light emitting diode (LED), e.g., "Parameter input blocked" on the weighing module 106 is preferably illuminated. Attaching the primary terminal cover 140 ensures that the weighing module 106 cannot be replaced. The terminal module 102 is thus permanently connected to the weighing module 106. The shield 150 is placed over the primary cover 140. The holes 148 and 152 in the lower corners of the cover 140 and shield 150 are aligned and an identification plate or sticker (not shown) is affixed to the shield 150. The identification sticker or label preferably includes a hole corresponding to the shield 150 and primary cover 140, and the wire 162 may be passed through the identification sticker/plate as well. The sealing wire 162 is then fed through the holes 148 and 152 and identification label or sticker to allow the unit to be mechanically sealed. Tampering with the unit calibration would require the user to physically break the seal. The sticker preferably identifies the scale 130, its calibration values, serial number, Certificate of Compliance number, and model number on the terminal cover 150. The sticker or label preferably will self-destruct upon removal.

The weighing module or evaluation electronics unit 106 may include a rating plate 164 with manufacturer's specifications. The calibration values may be repeated on an adhesive label strip next to the display 166 or other convenient place.

Figure 2A:
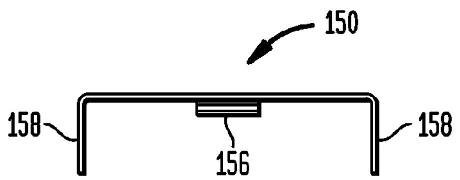
FIGS. 2A-2C shows various views of the shield of FIG. 1 in greater detail.
Figure 2B:
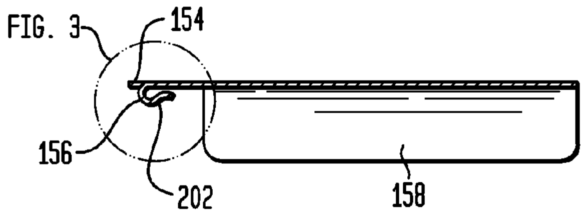
Figure 2C:
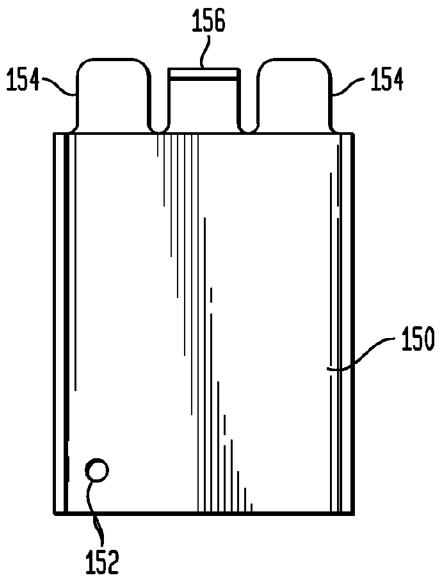

Referring to FIGS. 2A-2C, the shield 150 is depicted in several views. FIG. 2A shows a front view of the shield 150 so that latch portion 156 and lateral portions or laterals 158 can be seen. FIG. 2B is a side view of shield 150. Latch portion 156 includes a hooked portion 202 which receives the primary cover 140 therein. The hooked portion 202 works in conjunction with the wire 162 (FIG. 1) and laterals 158 to ensure that the shield 150 is secured to the primary cover 140. The laterals 158 restrict side to side motion between the shield 150 and the primary cover 140. The hooked portion 202 prevents lifting the shield 150 from the primary cover 140. This means the only way to remove the shield 150 is to slide the shield 150 up passed the primary cover 140 to unlatch the shield 150. The wire 162 makes this impossible since the configuration is designed to ensure that the wire 162 is broken before the shield 150 can be removed. Detail is magnified and shown in FIG. 3.

Figure 3:
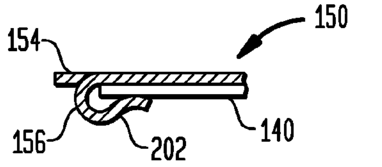
FIG. 3 is a cross-sectional view of a latch portion of the shield shown securing the primary cover.

Referring to FIG. 2C, extensions 154 provide bending support for the latch portion 156 to prevent bending the shield 150 at the base of the latch portion 156. Extensions 154 help to prevent the possibility of bending the latch portion 156 off from the primary contact 140 in the event that the wire 162 includes slack. Extensions 154 help to transfer the bending moment to the hooked portion 202 to prevent the possibility of an unauthorized release of the shield 150. A magnified view of the hooked portion 202 installed on the primary cover 140 is shown in FIG. 3.

Figure 4:
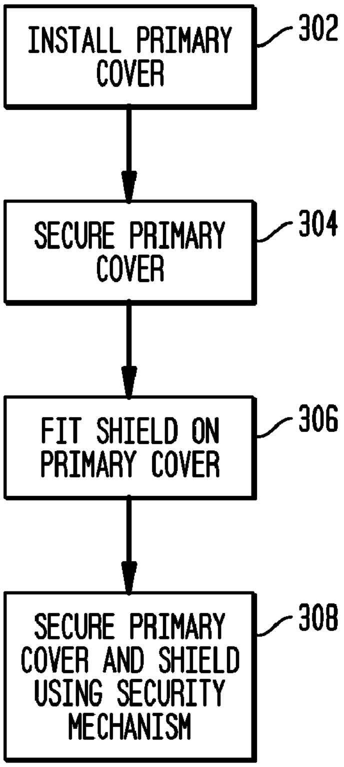
FIG. 4 is a flow diagram showing a method for protecting the weighing module's calibration access controls in accordance with the present principles.

Referring to FIG. 4, a method for preventing access to write protected calibration parameters is illustratively depicted. In block 302, access is excluded to an underlying area where calibration controls are located by installing a primary cover including a connection device and an access hole which permits access to the underlying area for securing the primary cover. In block 304, the primary cover is secured using the connection device by accessing the underlying layer through the access hole. A shield configured to fit over the primary cover is placed to prevent access to the access hole in block 306. The shield includes a latch portion configured to latch on a first end portion of the primary cover. In block 308, the primary cover and the shield are sealed with a security mechanism which passes through a first through formed in the primary cover and a second through hole formed in the shield at a corresponding location such that the security mechanism needs to be overcome or otherwise destroyed to access the underlying area. The security mechanism is configured to show signs of tampering when unauthorized access the underlying area is attempted.

Having described preferred embodiments for a calibration module shield and protection method (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. An apparatus for preventing access to write protected calibration parameters, comprising:

a primary cover including a connection device, an access opening and a first through hole, the primary cover being configured to cover and exclude access to an underlying area where calibration controls are located, the access opening being located on the primary cover to permit access to the underlying area when securing the primary cover over the underlying area;

a shield configured to fit over the primary cover and prevent access to the access opening, the shield including a latch portion configured to latch on a first end portion of the primary cover and a second through hole located at a second end portion opposite the first end portion and corresponding to the first through hole of the primary cover; and a security mechanism configured to be received in the first and second through holes such that the security mechanism shows signs of tampering when unauthorized access to the underlying area is attempted.

2. The apparatus as recited in claim 1, wherein the primary cover includes tabs along sides thereof and the underlying area includes slots for receiving the tabs.

3. The apparatus as recited in claim 1, wherein the shield includes lateral portions which fit over sides of the primary cover.

4. The apparatus as recited in claim 1, wherein the latch portion includes a hooked portion configured to wrap around an end of the primary portion.

5. The apparatus as recited in claim 1, wherein the shield a support extension adjacent to and in the plane of the latch portion.

6. The apparatus as recited in claim 1, wherein the access opening provides access to a fixing screw employed to secure the primary cover.

7. The apparatus as recited in claim 1, wherein the underlying area includes a connection board having connection terminals and the primary cover protects against access to a jumper connecting terminals to disable an ability to adjust the calibration parameters.

8. The apparatus as recited in claim 1, wherein the security mechanism includes a crush wire and a seal.

9. The apparatus as recited in claim 1, wherein the primary cover includes a notch for receiving the latch portion of the shield.

10. A calibration system, comprising:

an electronic calibration module;

a terminal module interlocking with the calibration module such that a terminal connection board provides access to and permits write protection of calibration parameters stored in the calibration module when appropriately configured;

a primary cover including a connection device, an access opening and a first through hole, the primary cover being configured to cover and exclude access to at least a portion of the terminal connection board where calibration controls are located, the access opening being located adjacent to the connection device to permit access to the portion of the terminal connection board when securing the primary cover over the underlying area;

a shield configured to fit over the primary cover and prevent access to the access opening, the shield including a latch portion configured to latch on a first end portion of the primary cover and a second through hole located at a second end portion opposite the first end portion and corresponding to the first through hole of the primary cover; and a security mechanism configured to be received in the first and second through holes such that the security mechanism needs to be destroyed prior to access the portion of the terminal connection board.

11. The calibration system as recited in claim 10, wherein the primary cover includes tabs along sides thereof and the terminal connection board includes slots for receiving the tabs.

12. The calibration system as recited in claim 10, wherein the shield includes lateral portions which fit over sides of the primary cover.

13. The calibration system as recited in claim 10, wherein the latch portion includes a hooked portion configured to wrap around an end of the primary portion.

14. The calibration system as recited in claim 10, wherein the shield includes a support extension adjacent to and in the plane of the latch portion.

15. The calibration system as recited in claim 10, wherein the access opening provides access to a fixing screw employed to secure the primary cover.

16. The calibration system as recited in claim 10, wherein the terminal connection board includes a jumper connecting terminals to disable an ability to calibrate the calibration parameters.

17. The calibration system as recited in claim 10, wherein the security mechanism includes a wire and a seal.

18. The calibration system as recited in claim 10, wherein the primary cover includes a notch for receiving the latch portion of the shield.

19. A method for preventing access to write protected calibration parameters, comprising:

eliminating access to an underlying area where calibration controls are located by installing a primary cover including a connection device and an access opening which permits access to the underlying area when securing the primary cover over the underlying area;

securing the primary cover using the connection device by accessing the underlying layer through the access opening;

placing a shield configured to fit over the primary cover to prevent access to the access opening, the shield including a latch portion configured to latch on a first end portion of the primary cover; and sealing the primary cover and the shield with a security mechanism which passes through a first through formed in the primary cover and a second through hole formed in the shield at a corresponding location such that the security mechanism needs to be overcome to access the underlying area.

* * * * *